United States Patent
Garrison

(10) Patent No.: US 8,365,397 B2
(45) Date of Patent: Feb. 5, 2013

(54) METHOD FOR PRODUCING A CIRCUIT BOARD COMPRISING A LEAD FRAME

(75) Inventor: Mark Garrison, Minden, NV (US)

(73) Assignee: EM Research, Inc., Reno, NV (US)

(*) Notice: Subject to any disclaimer, the term of this patent is extended or adjusted under 35 U.S.C. 154(b) by 986 days.

(21) Appl. No.: 12/112,805

(22) Filed: Apr. 30, 2008

(65) Prior Publication Data
US 2009/0035957 A1 Feb. 5, 2009

Related U.S. Application Data

(60) Provisional application No. 60/953,653, filed on Aug. 2, 2007, provisional application No. 61/031,665, filed on Feb. 26, 2008.

(51) Int. Cl.
*H03K 3/42* (2006.01)
(52) U.S. Cl. .............. 29/827; 29/830; 29/852; 174/255; 174/266
(58) Field of Classification Search .............. 29/827, 29/830, 831, 852; 174/255, 266
See application file for complete search history.

(56) References Cited

U.S. PATENT DOCUMENTS

| | | | |
|---|---|---|---|
| 3,714,370 A | 1/1973 | Nixen et al. | |
| 4,649,461 A * | 3/1987 | Matsuta | 361/799 |
| 4,845,313 A * | 7/1989 | Endoh et al. | 174/261 |
| 5,147,210 A | 9/1992 | Patterson et al. | |
| 5,173,766 A | 12/1992 | Long et al. | |
| 5,223,676 A * | 6/1993 | Yamamoto et al. | 174/250 |
| 5,266,912 A | 11/1993 | Kledzik et al. | |
| 5,559,364 A | 9/1996 | Hojyo | |
| 5,767,527 A | 6/1998 | Yoneda et al. | |
| 5,818,102 A | 10/1998 | Rostoker et al. | |
| 6,130,473 A | 10/2000 | Mostafazadeh et al. | |
| 6,617,671 B1 | 9/2003 | Akram | |
| 6,664,615 B1 | 12/2003 | Bayan et al. | |
| 6,747,341 B2 | 6/2004 | Knapp et al. | |
| 6,768,186 B2 | 7/2004 | Letterman, Jr. et al. | |
| 6,791,169 B2 | 9/2004 | Carson | |
| 7,008,825 B1 | 3/2006 | Bancod et al. | |
| 7,009,309 B1 | 3/2006 | Chiang | |
| 7,159,311 B2 | 1/2007 | Wark et al. | |
| 7,187,072 B2 | 3/2007 | Fukutomi et al. | |
| 7,190,062 B1 | 3/2007 | Sheridan et al. | |
| 7,246,434 B1 | 7/2007 | Taylor et al. | |
| 2003/0006055 A1 | 1/2003 | Chien-Hung et al. | |
| 2004/0000702 A1 | 1/2004 | Knapp et al. | |
| 2007/0200210 A1 | 8/2007 | Zhao et al. | |

FOREIGN PATENT DOCUMENTS

GB 2237144 A * 4/1991

* cited by examiner

*Primary Examiner* — Livius R Cazan
(74) *Attorney, Agent, or Firm* — Ian F. Burns & Associates, P.C.

(57) ABSTRACT

A sub-component circuit board may be electrically and mechanically connected to a higher order circuit board using one or more leads extending from a lead frame embedded in the sub-component circuit board. The sub-component board is produced as a layered assembly with the embedded lead frame at the core. One or more dielectric layers and one or more circuitry layers are provided over the lead frame and then bonded using heat and pressure. Apertures in the dielectric and circuitry layers define a perimeter of the circuit board where the leads of the lead frame are exposed. The lead frame connects to the circuitry layer(s) using plated vias.

9 Claims, 11 Drawing Sheets

METHOD FOR PRODUCING A CIRCUIT BOARD COMPRISING A LEAD FRAME

CROSS REFERENCE TO RELATED APPLICATIONS

This application claims priority to U.S. provisional patent application Ser. No. 60/953,653, filed Aug. 2, 2007, and to U.S. provisional patent application Ser. No. 61/031,665 filed Feb. 26, 2008, the contents of which are herein incorporated by reference.

FIELD OF THE INVENTION

The present invention relates to wiring boards, printed circuit boards and the like and to systems and methods for connecting printed circuit boards to larger components.

BACKGROUND

Printed wiring boards or circuit boards are typically fabricated using an insulated layer of material with a conductive layer attached on each side. Circuitry is etched on the exterior conductive layer(s) using a combination of photo images and chemical etching to create the desired circuitry. Integrated circuits and many other electronic components may be added to these circuit boards and the assembled boards may be placed into packages. These circuit board packages may be used as sub assemblies and placed on other larger boards.

In order to attach these packages to a circuit board, some form of electrical connection must be made. Typical prior art package design uses a series of plated through holes around the exterior edges called castellations. The outside edges of the boards are machined to expose half of the castellation. The overall outside dimensions of these devices coincides with the end users product layout and is soldered onto their circuit card assembly. The half castellations provide the solder joint to mechanically and electrically connect the electronic packages to the next higher level assembly. Castellations of this style are common for low cost applications and have been in use for many years.

Problems associated with a castellation style termination are numerous for both original equipment manufacturers and their customers. Manufacturing problems include the presence of burrs from the machining process and from the process to singulate the boards from multi-board panels to produce the individual circuit card assembly. Burrs are unacceptable due to the potential of causing shorts from any loose conductive materials left on the printed circuit card assembly. Scoring and routing techniques are used to perform this depaneling process; both are inconsistent and rely on the individual operator's skill to repeat this operation consistently.

End users assembling electronic packages with end castellations typically stencil solder paste onto conductive pads and place the circuit boards with end castellation onto the solder paste. The solder paste is heated to sufficiently reflow into a smooth solder connection between the solder pads and the end castellations. A number of issues arise from this process. First, cleaning between the two printed circuit boards is difficult due to the zero clearance interfaces between the two printed circuit boards. Second, inspection of the reflowed solder paste between the assemblies is impossible due to the limited visual access at the interface joint. Third, removal of the part for troubleshooting and/or repair requires extreme heat directed at both the top and bottom circuit card assemblies in order to bring the temperature to an adequate level to reflow the solder. Many times these temperature extremes damage the solder joints or create open or short circuits to the internal components of the electronic packages.

U.S. Pat. No. 7,246,434 to Taylor et al. purports to describe providing an alternative attachment mechanism using standoffs integrally formed with a printed circuit board. The standoffs provide a gap between a printed circuit board module and the larger printed circuit board component to which the module is attached. However, the system described in the Taylor patent still relies on castellations to provide electrical connection, with all of the problems of castellations described above as well as an excessive amount of machining needed to remove material from the component under body to create the standoff.

SUMMARY OF ONE EMBODIMENT OF THE INVENTION

Advantages of One or More Embodiments of the Present Invention

The various embodiments of the present invention may, but do not necessarily, achieve one or more of the following advantages:

the ability to readily connect circuit boards to higher order components;

provide a circuit board that does not rely on castellation connections;

provide an accessible cleaning interface at the solder connection of the circuit boards;

provide a circuit board that is easier to manufacture;

provide a circuit board that is more reliable to manufacture; and provide a circuit board that is more reliable to assemble to other circuit boards.

These and other advantages may be realized by reference to the remaining portions of the specification, claims, and abstract.

Brief Description of One Embodiment of the Present Invention

In one aspect, the present disclosure provides a method of producing a circuit board comprising using at least one lead frame having a plurality of leads. At least one circuitry layer having one or more conductive traces is provided over the at least one lead frame to produce a layered assembly. The layered assembly is then bonded and an electrical connection is made between at least one of the conductive traces and at least one of the plurality of leads. One or more of the leads are then exposed at a perimeter of the circuit board.

In one aspect, the present disclosure provides a lead frame comprising a plurality of unit cells each having a perimeter and one or more leads extending inward of the perimeter. A face of the lead frame is configured to receive at least one circuit board layer.

In one aspect, the present disclosure provides a circuit board comprising a layered assembly. At least one lead frame is embedded in the layered assembly with one or more leads of the lead frame protruding from a perimeter of the layered assembly. At least one electrical connection is provided from the one or more leads to at least one conductive trace of the layered assembly.

In one aspect, the present disclosure provides a circuit board comprising connection means for connecting a component circuit board. The connection means comprises means for receiving one or more leads of a lead frame embedded in the component circuit board.

In one aspect, the present disclosure provides a method of connecting a first circuit board to a second circuit board. The first circuit board comprises a layered assembly, a lead frame embedded in the layered assembly and one or more leads of the lead frame protruding from a perimeter of the layered assembly. The second circuit board comprises one or more contact portions configured to receive the one or more leads. The first circuit board is connected to the second circuit board by engaging the one or more leads with the one or more contact portions.

The above description sets forth, rather broadly, a summary of one embodiment of the present invention so that the detailed description that follows may be better understood and contributions of the present invention to the art may be better appreciated. Some of the embodiments of the present invention may not include all of the features or characteristics listed in the above summary. There are, of course, additional features of the invention that will be described below and will form the subject matter of claims. In this respect, before explaining at least one preferred embodiment of the invention in detail, it is to be understood that the invention is not limited in its application to the details of the construction and to the arrangement of the components set forth in the following description or as illustrated in the drawings. The invention is capable of other embodiments and of being practiced and carried out in various ways. Also, it is to be understood that the phraseology and terminology employed herein are for the purpose of description and should not be regarded as limiting.

DESCRIPTION OF CERTAIN EMBODIMENTS OF THE PRESENT INVENTION

In the following detailed description of the preferred embodiments, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

Figure 1:
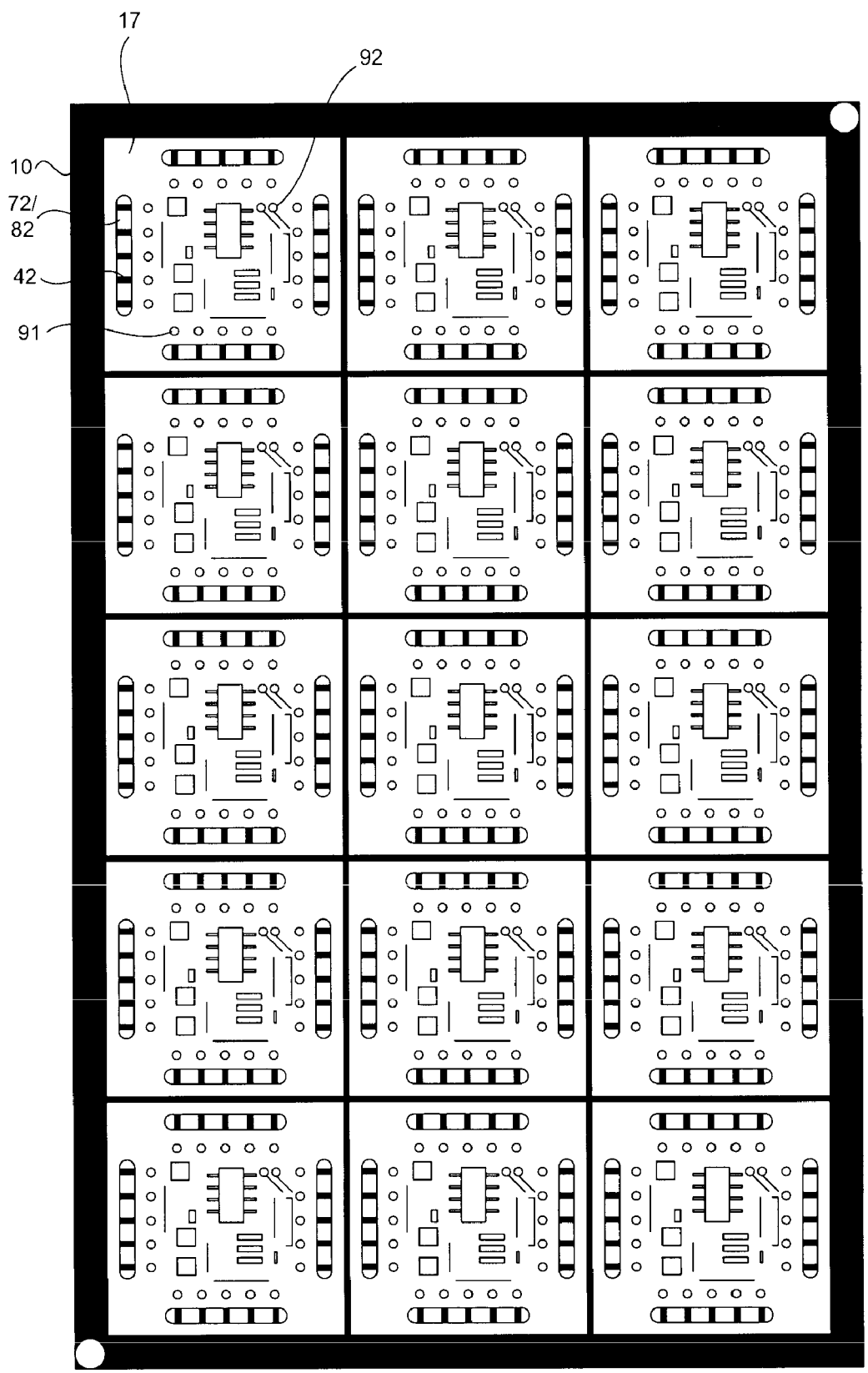
FIG. 1 is substantially a plan view of a layered assembly circuit board array.

With reference to FIG. 1, there is shown a layered assembly circuit board array 10 comprising individual unit cells 17. The layered assembly circuit board array 10 has a laminated structure shown in an exploded view in FIG. 2. An embedded lead frame 12, described in more detail below, is provided as an inner layer. Copper clad material layers 16 are used for providing the electronic circuitry. The copper clad material is a dielectric insulator with a conductive surface(s) applied to either or both sides. Dielectric materials suitable for use in the copper clad material layer 16 include FR4, Teflon, Ceramic and the like. Images of the circuitry are exposed and etched into the conductive surface(s) prior to laminating using known techniques.

Pre-impregnated (prepreg) dielectric layers 14 are provided between the conductive layers 16 and the lead frame 12. The prepreg layers 14 uses a material of similar dielectric characteristic as the copper clad material layers 16, but has no conductive surface treatment. The dielectric material is impregnated with a resin used to bond the contacting layers. Material thickness for the prepreg layers 14 can vary depending on the specific application. In one embodiment, the thickness of the prepreg layers 14 is approximately 0.0035".

Figure 2:
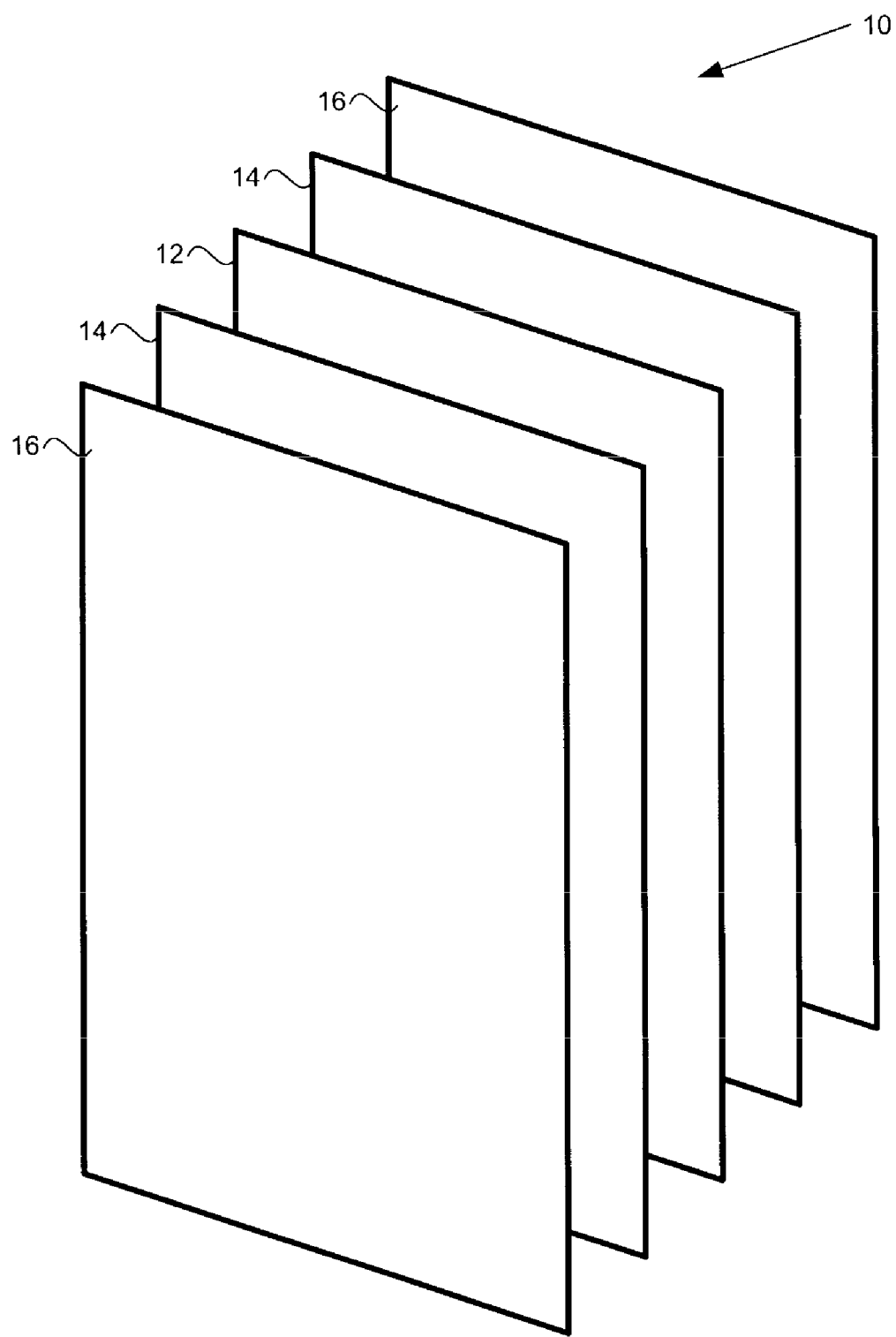
FIG. 2 is substantially an exploded view of the layered assembly of FIG. 1.

While FIG. 2 shows two copper clad material layers 16 and two prepreg layers 14, a person skilled in the art will readily understand that differing numbers of copper clad material layers 16 and prepreg layers 14 may be provided. For example, in one embodiment, a single copper clad material layer 16 may be provided with a layer of prepreg material 14 provided to each side of the lead frame 12.

Figure 3:
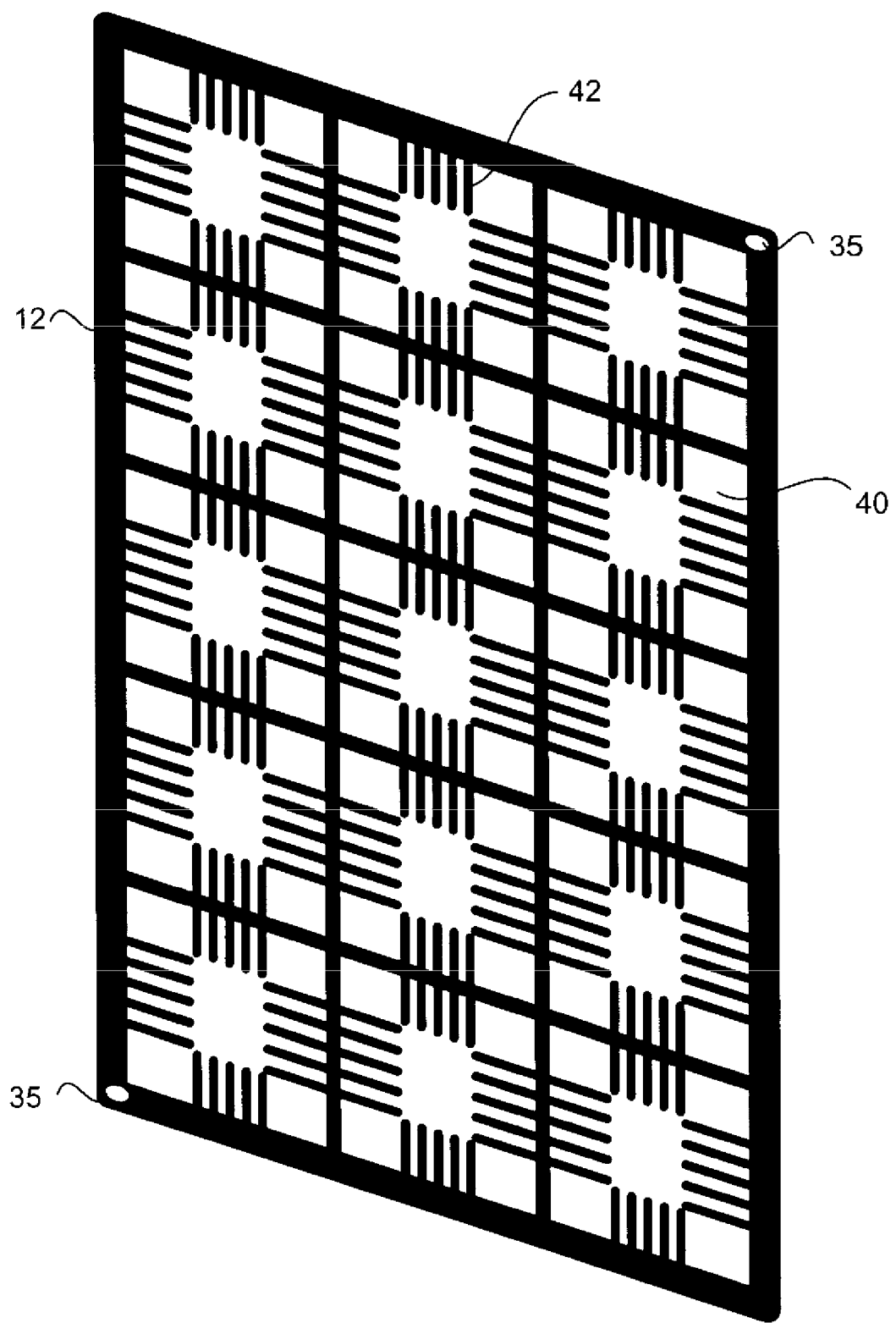
FIG. 3 is substantially a view of a lead frame for forming a circuit board.
Figure 4:
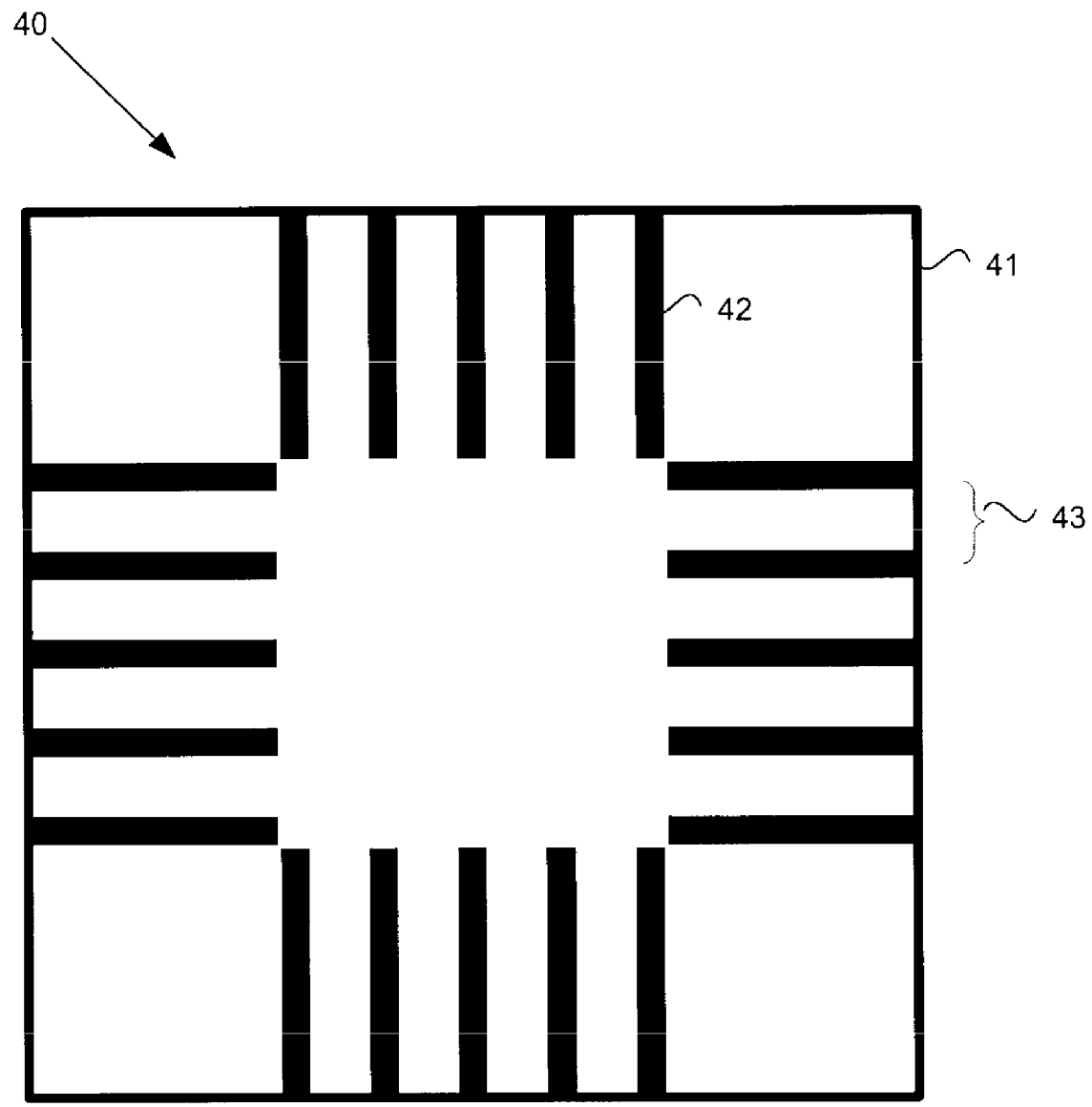
FIG. 4 substantially shows a unit cell of the lead frame of FIG. 3.
Figure 5:
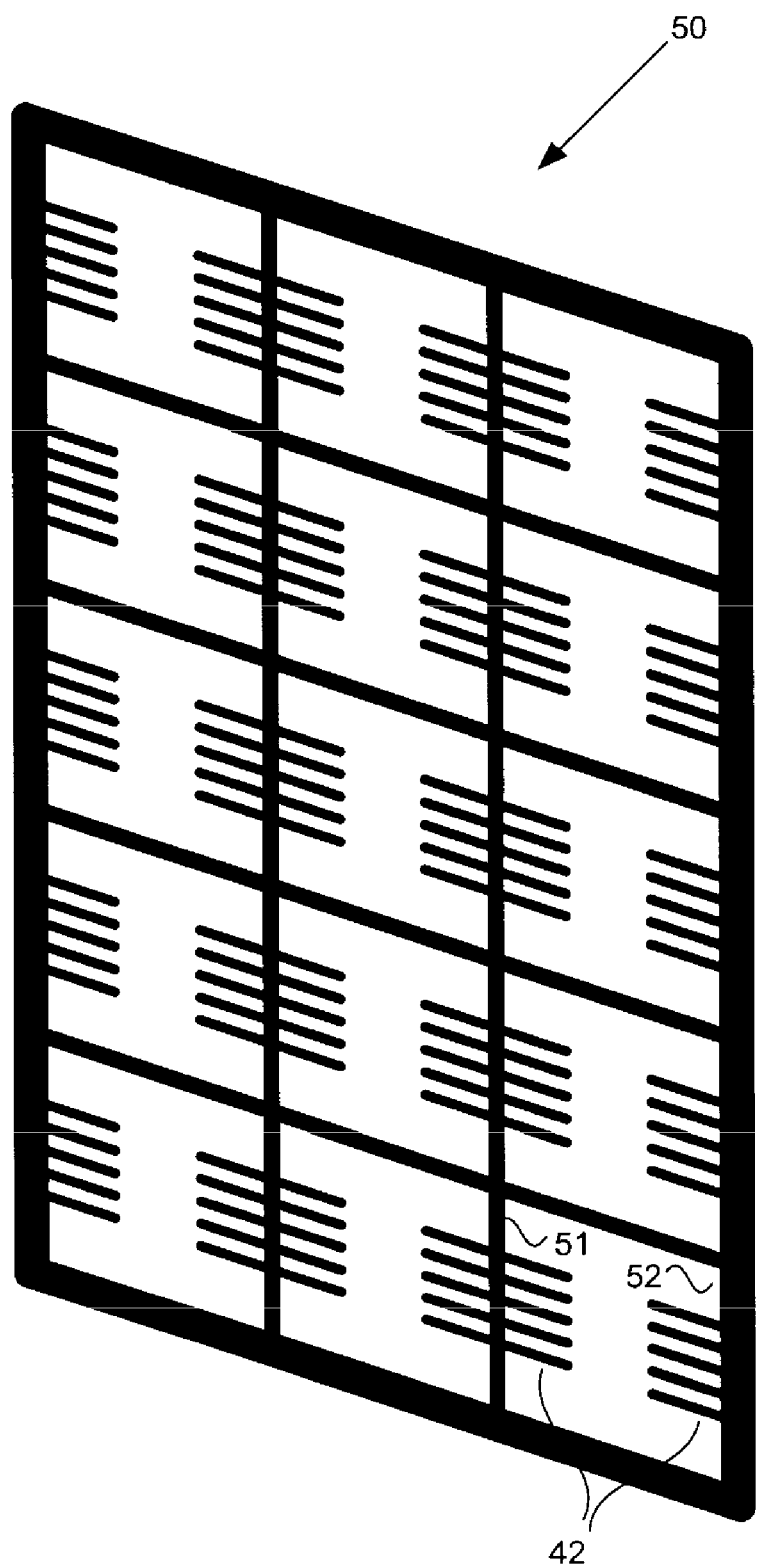
FIG. 5 is substantially a view of an alternative lead frame.

The lead frame 12 is shown in more detail in FIG. 3. The lead frame 12 may start with a conductive foil, typically a copper alloy, though other conductive materials may be used, including, but not limited to copper, aluminum, brass, tin. The thickness of the lead frame 12 may be dependent on the application. In one embodiment, the lead frame thickness may be between 0.002" and 0.006". The lead frame 12 may be made by photochemical chemical etching or stamping. A unit cell 40 of the lead frame 12 is shown in more detail in FIG. 4. The unit cell 40 has an outer perimeter 41 depicted in a square configuration, though a person skilled in the art will readily understand that alternative configurations are possible, including rectangular, hexagonal, triangular, circular and any suitable regular or irregular shape. Extending inward from the outer perimeter 41 are multiple lead lines 42 for forming leads in the final processing stages. The number and location of the multiple lead lines 42 will depend on the final application. The unit cell 40 of FIG. 4 depicts a quad package, i.e. the multiple lead lines 42 extend from all four sides, with twenty pins 42 in total. However, alternative configurations such as inline packages (leads extending from only one side), dual inline packages (leads extending from two sides) or combinations these are possible. An example of a lead frame 50 for a dual inline package is illustrated in FIG. 5 which shows leads 42 extending from a first side 51 and an opposite second side 52 of the perimeter of the unit cell.

In addition to the number and configuration of the pins, the unit cell 40 determines the lead spacing, or pitch 43, of the leads. In one embodiment, the lead pitch 43 may be as small as 0.020".

As will be described below, the various material layers may be pre-machined to expose the multiple lead lines 42 of the lead frame 40 prior to stacking and bonding all layers together. The lead frame 12 leads are used as the device legs for the mechanical and electrical connection when installed onto an electronic circuit. Thus, the overall dimensions of the unit cell 40 determine the size of a printed circuit board unit made using the lead frame 12. Any suitable number of unit cells 40 may be provided within the lead frame 12. The lead frame 12 of FIG. 3 is shown with the same unit cell 40 replicated across the lead frame 12. In one embodiment, different unit cells may be used within a single lead frame depending on the final circuit board array 10 to be produced. The lead frame 12 may be provided with one or more tooling holes 35 to aid in alignment with the other layers of the circuit board during assembly.

Figure 6:
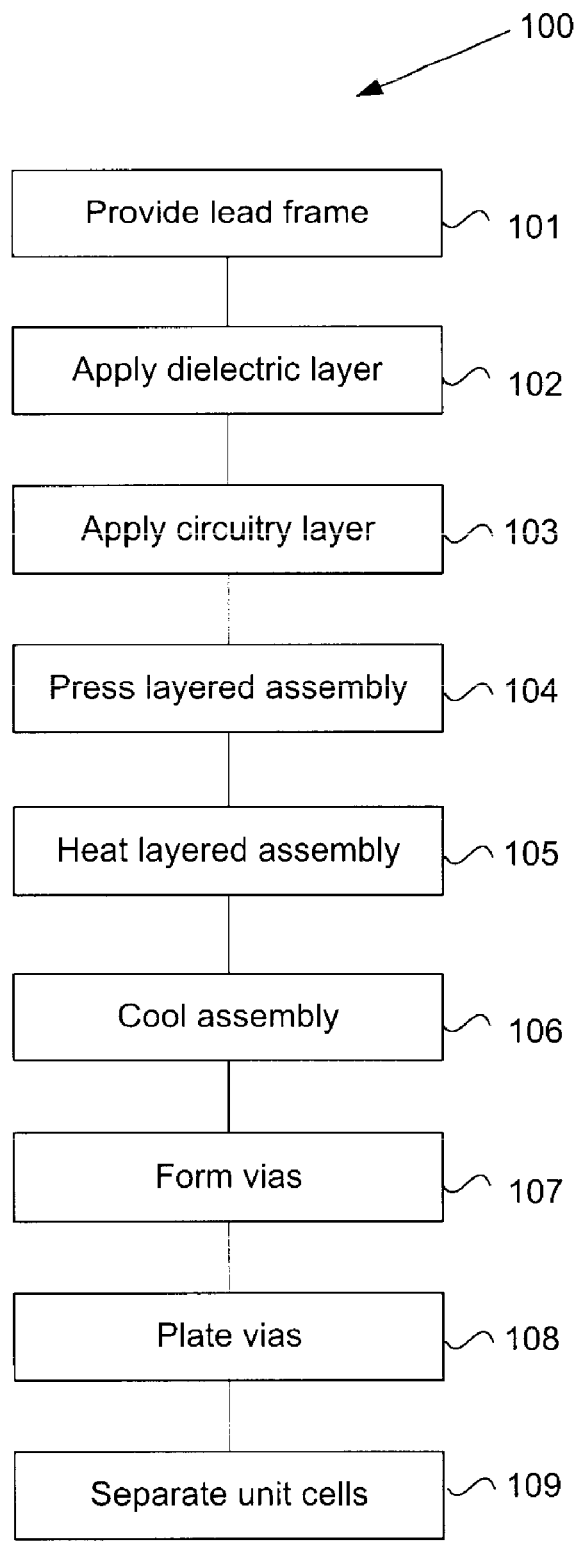
FIG. 6 is substantially a flowchart of a process for forming a circuit board using a lead frame.
Figure 7:
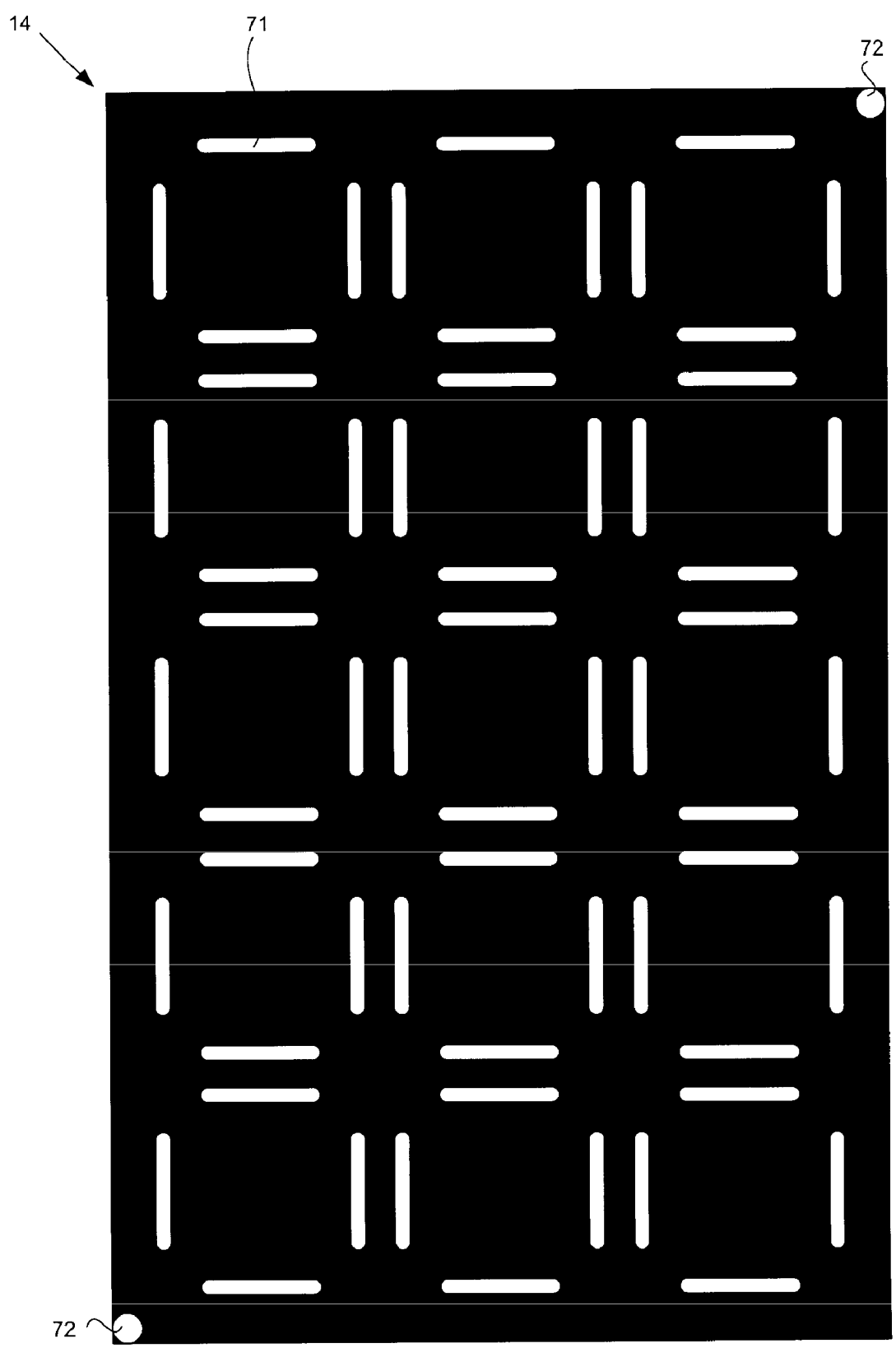
FIG. 7 is substantially a plan view of a dielectric layer.

A process for manufacturing a printed circuit board using the lead frame 12 described above will be described with reference to the flowchart 100 of FIG. 6. At step 101, the lead frame 12 is provided with a predetermined number, configuration and pitch of the multiple lead line 42. At step 102, a layer of prepreg material 14 is placed on both sides of the lead frame 12. A prepreg layer 14 is illustrated in FIG. 7. The prepreg layer 14 may be pre-machined with apertures 71 so that multiple lead lines 42 of the lead frame 12 are exposed. The apertures 71 may be sized to expose the desired lead length for the final lead configuration requirements. Tooling holes 72 may be used to align the lead frame 12, and the prepreg layer 14. Tooling holes 72 may also be used during the pre-machining processes.

Figure 8:
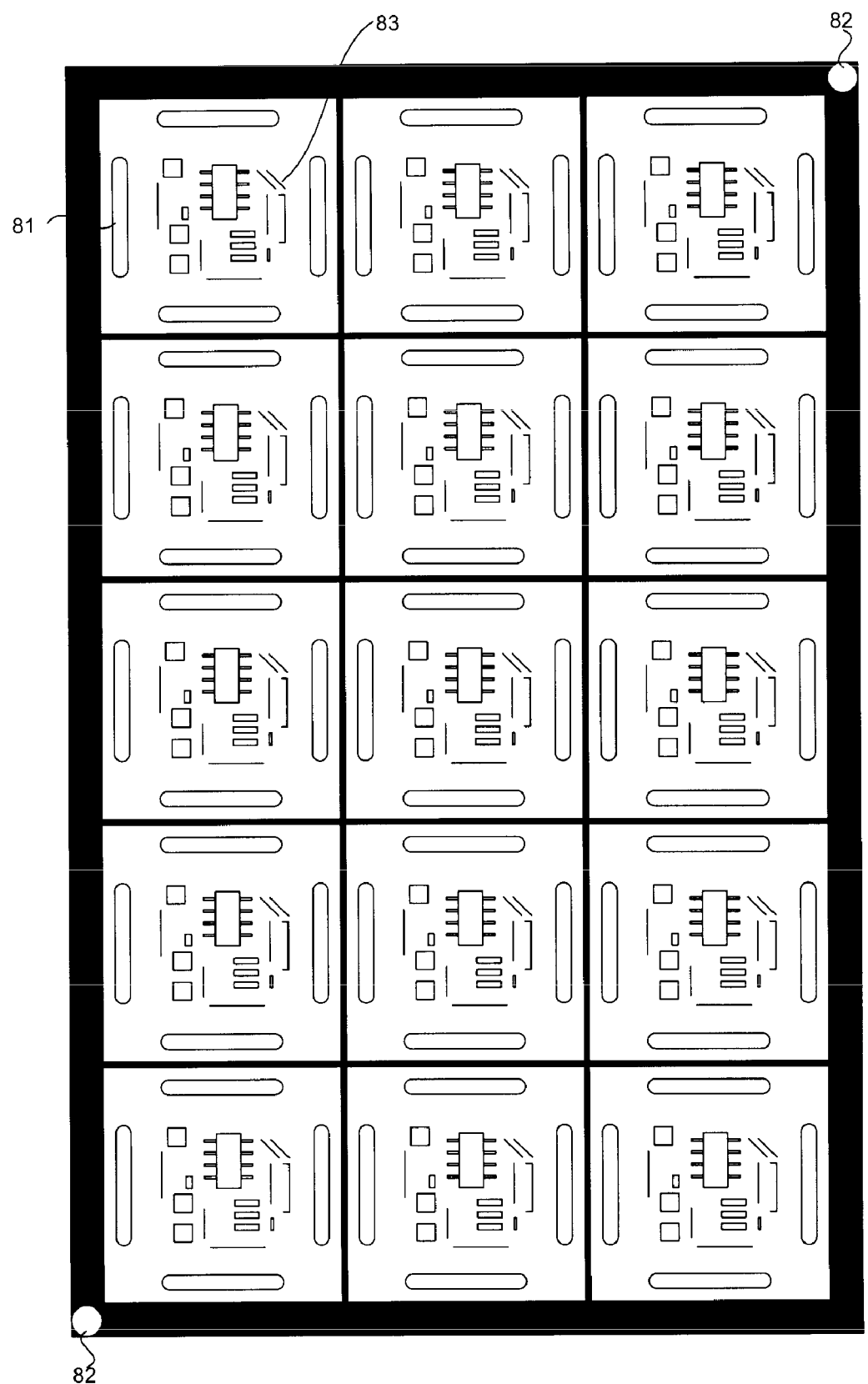
FIG. 8 is substantially a plan view of a circuitry layer.

Continuing the assembly process at step 103, the circuitry layer(s) 16 are provided on the prepreg layers 14. A circuitry layer 16 is illustrated in FIG. 8. The circuitry layers 16 may be pre-machined with apertures 81 so that the multiple lead lines 42 of the lead frame 12 are exposed in the layered assembly at the perimeter of the unit cell. The circuitry layers 16 may also be processed such that conductive traces 83 are formed prior to assembling the circuitry layers 16 with the prepreg layers 14 and the lead frame 12. Tooling holes 82 in the circuitry layer 16 may be used to align the lead frame 12, the prepreg layer 14, and the circuitry layer 16. The tooling holes 82 may also be used during the pre-machining processes for forming the apertures 81.

Multiple prepreg and circuitry layers can be used as required depending on the complexity of the final circuit.

Once all layers are assembled, the layered assembly is placed into a press, which is inside a vacuum assist oven, and pressed (step 104). In one embodiment, the layered assembly is pressed to a pressure of 350 psi. The assembly is then heated (step 105) in the oven to bond the layered assembly. In one embodiment, the heating step occurs by setting the oven temperature to increase the temperature at a rate of 5-7° F./min to achieve 360° F. for a period of 50 minutes. The pressing of the layered assembly may continue during the heating process.

The bonded layered assembly is then removed from the oven and press and allowed to cool (step 106). Holes or vias are then drilled or otherwise produced through the layered assembly at points where the inner conductive traces cross (step 107). These vias intersect the conductive traces which were previously etched onto the copper clad layers. Additional vias are drilled where connection between the circuitry layer and the embedded lead frame is required. After the vias are formed, a final plating process (step 108) is performed to connect all inner circuitry within the assembly. The plating process provides the electrical connection between various layers throughout the lead frame assembly including the exposed lead frame legs. FIG. 1 shows the final layered assembly 10 after the heating and plating processes with vias 91 for connecting the circuitry layer to the embedded lead frame. Vias 92 for interconnecting the circuitry layers, known in the art, are also shown.

Figure 12:
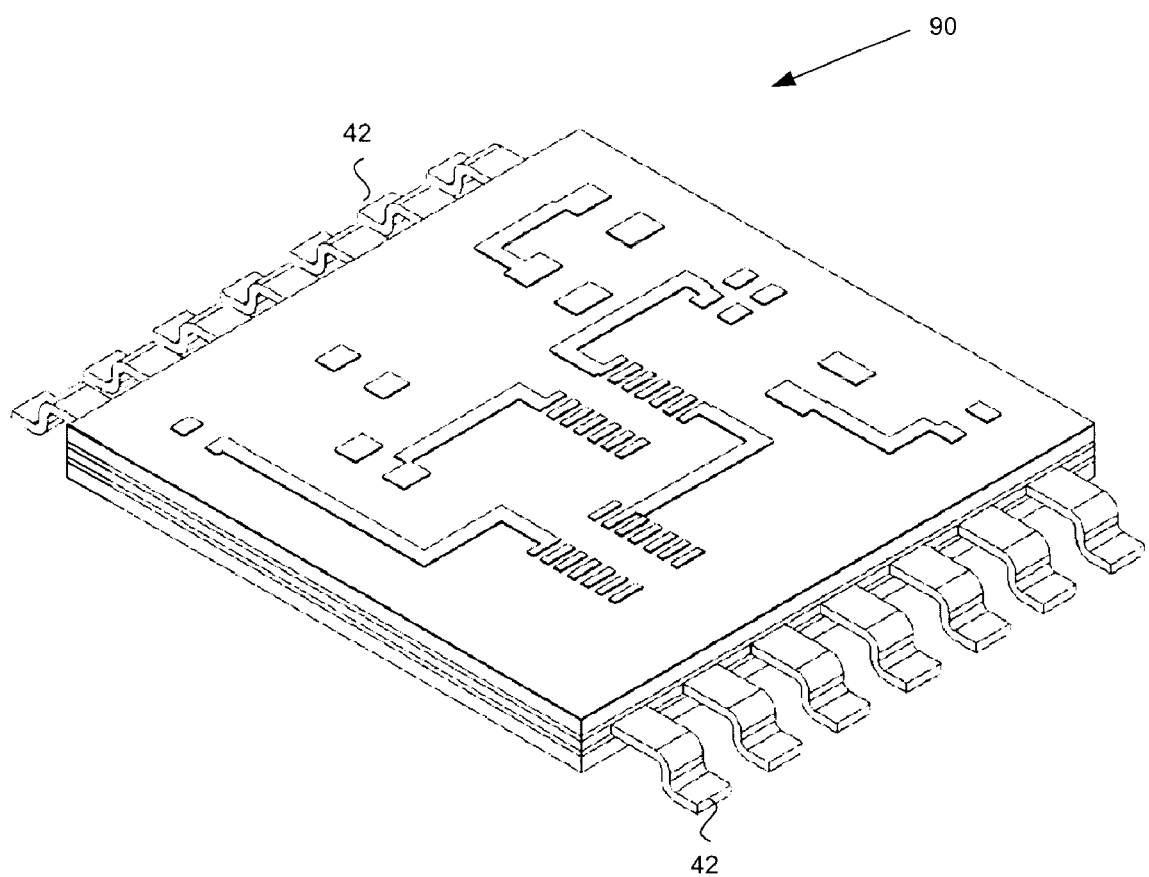
FIG. 12 substantially shows a 3D rendering of the completed package with leads extending from the internal lead frame.

The individual unit cells 17 may then be separated from the layered assembly 10 by stamping, cutting or otherwise extracting the individual unit cells 17 from the layered assembly through the apertures 72, 82 where the multiple lead lines 42 are exposed (step 109). That is, the apertures 72, 82 define a perimeter of the bonded unit cell. This separation process cuts the leads from the lead frame 12 and produces an individual circuit board 90, shown in FIG. 9, having leads exposed around the perimeter of the circuit board. The individual circuit board 90 may be formed into an integrated circuit style of configuration by removing any unused portion of the layered assembly and by shaping the exposed multiple lead lines 42 as required, and as shown in FIG. 12. The style of the package shown in FIG. 12 mimics the appearance and mounting capabilities of an Integrated Circuit.

A final package 90 has the necessary circuitry to solder or epoxy in place discrete and active components for a functional circuit board. A lid attachment, as is known in the art, may be optional to cover the active and populated circuit board for the final assembly, although this does not have any significance to the lead frame design. The final package 90 thus allows an end user to attach the printed circuit board package on a high level circuit board in a way that is similar to an integrated circuit (IC).

Figure 9:
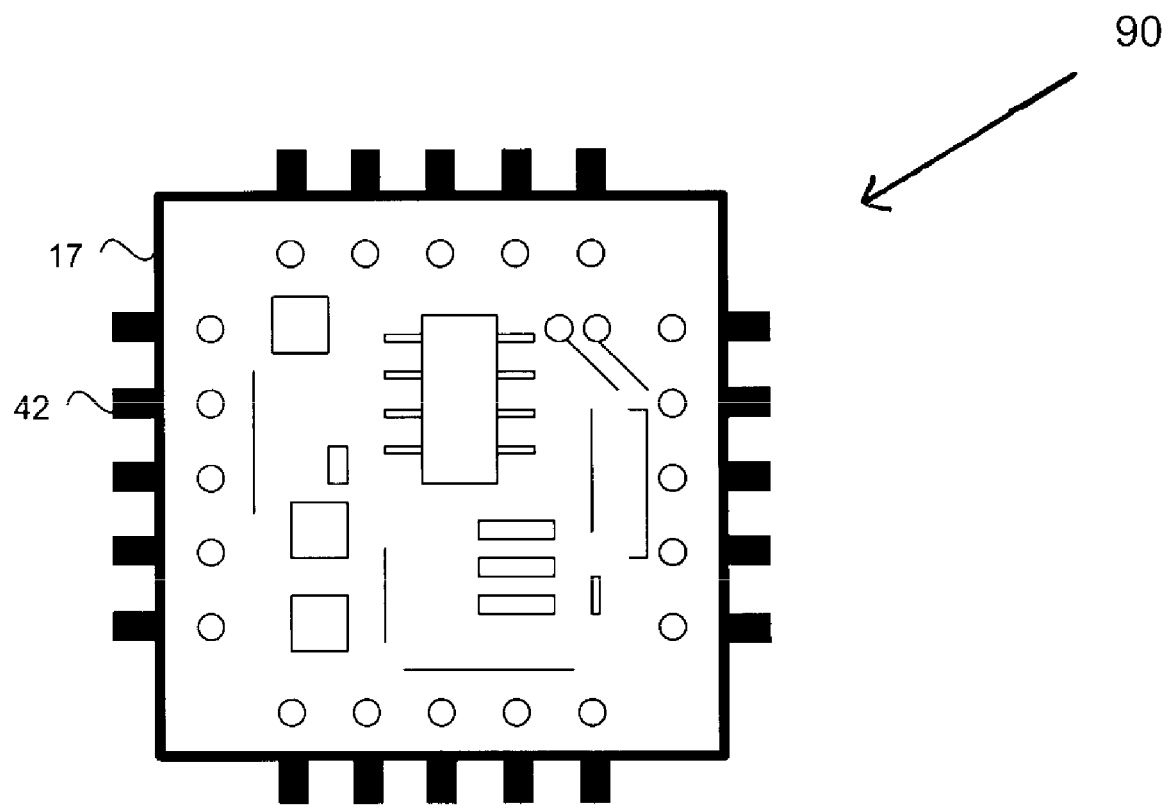
FIG. 9 is substantially a plan view of a formed circuit board unit cell.
Figure 10:
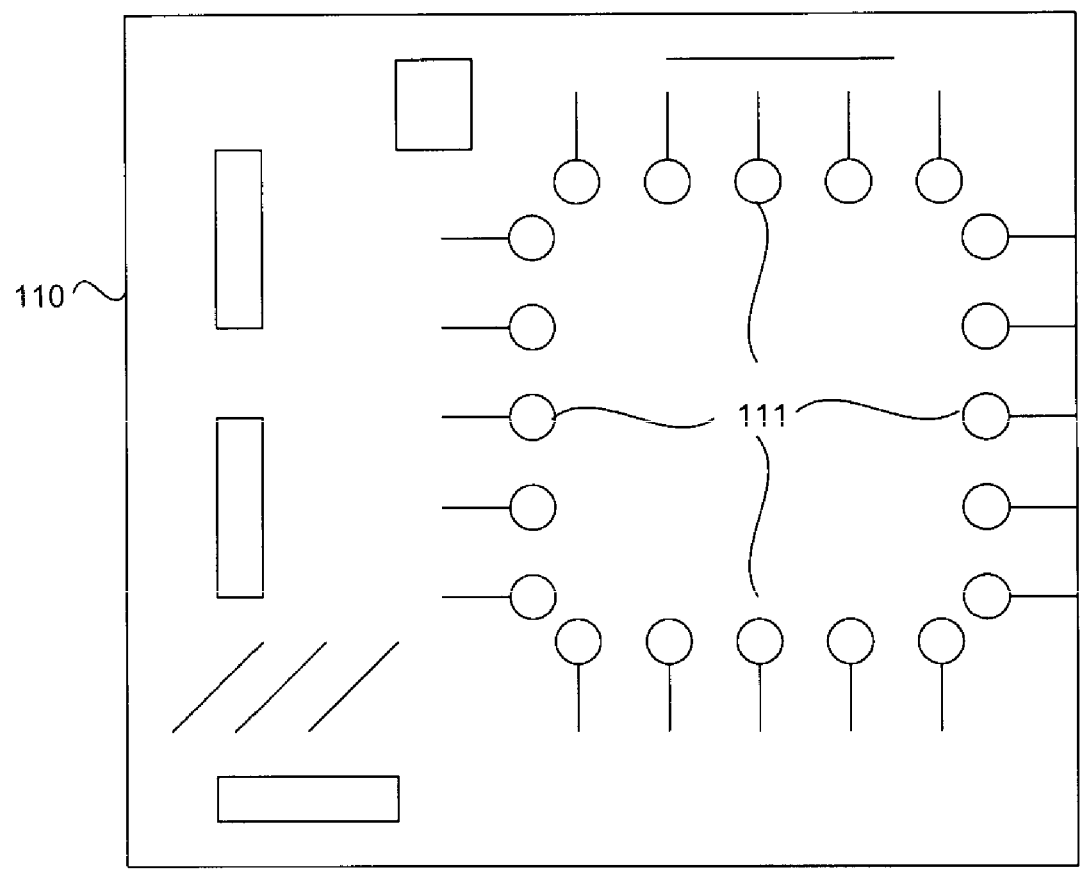
FIG. 10 is substantially a plan view of a parent circuit board for receiving the unit cell of FIG. 9.
Figure 11:
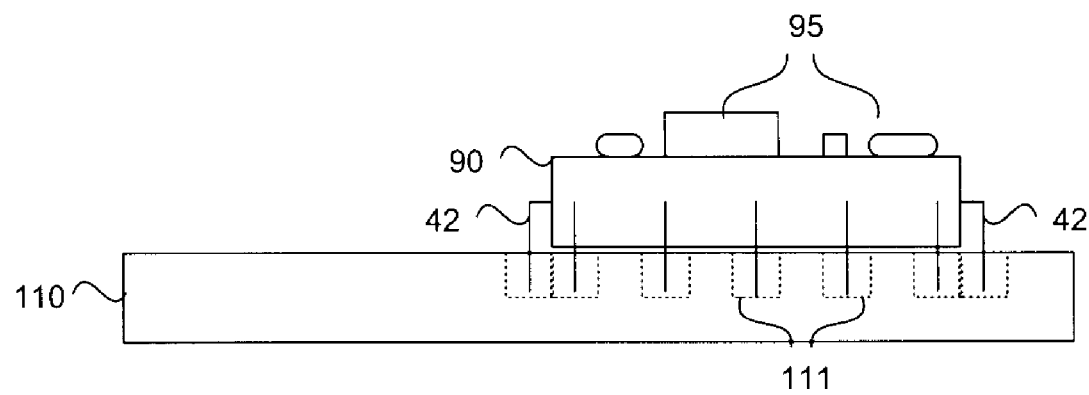
FIG. 11 substantially shows a unit cell attached to the parent circuit board.

FIG. 10 shows a circuit board 110 having contact portions 111 in the form of plated connection vias 111 for receiving the sub-component board 90 shown in FIG. 9. The plated vias 111 are pre-formed with a spatial relationship determined by the size of the fully formed sub-component board 90. Plated vias provide one form of connection means, but a person skilled in the art will readily understand that alternative connections means such as bond pads and the like may also be provided. In FIG. 11, a populated sub-component board 90 having components 95 provided thereon and with shaped multiple lead lines 42 extending out of the circuit board 90 from the embedded lead frame layer is press fitted into the circuit board 110, in a similar manner as for an integrated circuit chip. The sub-component board 90 may additionally be secured to the circuit board 110 by other means such as soldering.

As will be appreciated from the foregoing, a circuit board produced using a lead frame as described above has advantages over the prior art boards that require castellation connections. In particular, a sub-component board may be produced with pre-formed connection leads that can provide both electrical and mechanical connection to a parent circuit board.

Although the description above contains many specifications, these should not be construed as limiting the scope of the invention but as merely providing illustrations of some of the embodiments of this invention. Thus, the scope of the invention should be determined by the appended claims and their legal equivalents rather than by the examples given.

What is claimed is:

1. A method of producing a circuit board comprising:
   (A) providing at least one lead frame comprising a lead frame perimeter and a plurality of leads extending from the lead frame perimeter;
   (B) providing at least one circuitry layer over the at least one lead frame such that the circuitry layer covers at least a portion of the lead frame perimeter to produce a layered assembly, the circuitry layer comprising one or more conductive traces;
   (C) bonding the layered assembly;
   (D) forming at least one electrical connection from at least one of the conductive traces to at least one of the plurality of leads;

(E) exposing one or more of the plurality of leads to define a perimeter of the circuit board, the one or more exposed leads extending outward of the circuit board; and (F) removing the circuit board from the layered assembly, wherein the removed circuit board comprises the at least one electrical connection.

2. The method according to claim 1 further comprising providing at least one dielectric layer between the at least one circuitry layer and the at least one lead frame.

3. The method according to claim 1 wherein forming at least one electrical connection from at least one of the conductive traces to at least one of the plurality of leads comprises:

(A) forming a via between the at least one conductive trace and the at least one of the plurality of leads; and (B) plating the via.

4. The method according to claim 1 wherein the at least one lead frame and the at least one circuitry layer each comprise a plurality of unit cells.

5. The method according to claim 4 wherein bonding the layered assembly comprises forming a bonded unit cell comprising a lead frame unit cell and a circuitry layer unit cell.

6. The method according to claim 5 comprising removing at least one bonded unit cell from the layered assembly.

7. The method according to claim 1 wherein exposing one or more of the plurality of leads comprises pre-forming at least one aperture into the at least one circuitry layer and providing the at least one circuitry layer over the at least one lead frame such that the at least one aperture is provided over one or more leads of the circuit board.

8. The method according to claim 7 further comprising aligning the at least one aperture with the at least one lead frame to define a perimeter of a circuit board unit cell.

9. The method according to claim 8 further comprising separating the unit cell from the layered assembly at the at least one aperture.

* * * * *